United States Patent
Chen et al.

(10) Patent No.: US 8,455,354 B2
(45) Date of Patent: Jun. 4, 2013

(54) LAYOUTS OF POLY CUT OPENINGS OVERLAPPING ACTIVE REGIONS

(75) Inventors: Jung-Hsuan Chen, Hsin-Chu (TW); Yen-Huei Chen, Jhudong Township (TW); Li-Chun Tien, Tainan (TW); Hung-Jen Liao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 76 days.

(21) Appl. No.: 13/081,115

(22) Filed: Apr. 6, 2011

(65) Prior Publication Data

US 2012/0258592 A1    Oct. 11, 2012

(51) Int. Cl.
*H01L 21/28* (2006.01)
(52) U.S. Cl.
USPC ............ 438/666; 438/597; 257/E21.158
(58) Field of Classification Search
USPC ................ 438/597, 666; 257/E21.158
See application file for complete search history.

(56) References Cited

U.S. PATENT DOCUMENTS

| | | | |
|---|---|---|---|
| 8,039,203 B2* | 10/2011 | Wang et al. | 430/312 |
| 2003/0054623 A1* | 3/2003 | Weimer et al. | 438/587 |
| 2004/0063038 A1* | 4/2004 | Shin et al. | 430/311 |
| 2008/0160693 A1* | 7/2008 | Sim et al. | 438/261 |
| 2009/0027964 A1* | 1/2009 | Arai | 365/185.05 |
| 2009/0072322 A1* | 3/2009 | Lee et al. | 257/390 |
| 2009/0079005 A1* | 3/2009 | Haffner et al. | 257/368 |
| 2010/0164614 A1* | 7/2010 | Hou et al. | 327/565 |
| 2010/0330793 A1* | 12/2010 | Kim | 438/586 |
| 2012/0061764 A1* | 3/2012 | Lum et al. | 257/368 |
| 2012/0074499 A1* | 3/2012 | Haffner et al. | 257/368 |
| 2012/0119209 A1* | 5/2012 | Lee | 257/48 |

* cited by examiner

*Primary Examiner* — Alexander Ghyka
*Assistant Examiner* — Stanetta Isaac
(74) *Attorney, Agent, or Firm* — Slater & Matsil, L.L.P.

(57) ABSTRACT

A method of forming integrated circuits includes forming a mask layer over a gate electrode line, wherein the gate electrode line is over a well region of a semiconductor substrate; forming an opening in the mask layer, wherein a portion of the gate electrode line and a well pickup region of the well region are exposed through the opening; and removing the portion of the gate electrode line through the opening.

21 Claims, 7 Drawing Sheets

LAYOUTS OF POLY CUT OPENINGS OVERLAPPING ACTIVE REGIONS

BACKGROUND

With the reduction of the pitches of gate electrodes, which pitches are commonly referred to as POLY pitches, increasingly more strict design rules apply. For example, for POLY pitches of 90 nm or below, fixed poly pitches are required, wherein the gate electrodes and dummy gate electrodes in a wafer are formed as parallel lines having a uniform pitch.

Under the restricted design rules, there are limited spaces for forming well pickup regions since well pickup regions are typically formed between the parallel POLY lines. The well pickup regions are necessary for the circuits. However, the well pickup regions also occupy chip areas, and it is difficult to reduce the chip area penalty resulted from the well pickup regions.

SUMMARY

In accordance with some embodiments, a method includes forming a mask layer over a gate electrode line. The gate electrode line is over a well region of a semiconductor substrate. An opening is formed in the mask layer, wherein a portion of the gate electrode line and a well pickup region of the well region are exposed through the opening. The portion of the gate electrode line exposed through the opening is removed. Other embodiments are also disclosed. In the embodiments of the present disclosure, well pickup regions do not have to be inserted between dummy polysilicon lines, which require addition chip area. The chip area may thus be saved.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A method of forming contact plugs to access well pickup regions is provided in accordance with an embodiment. The intermediate stages of manufacturing various embodiments are illustrated. The variations of the embodiment are then discussed. Throughout the various views and illustrative embodiments, like reference numbers are used to designate like elements.

Figure 1A:
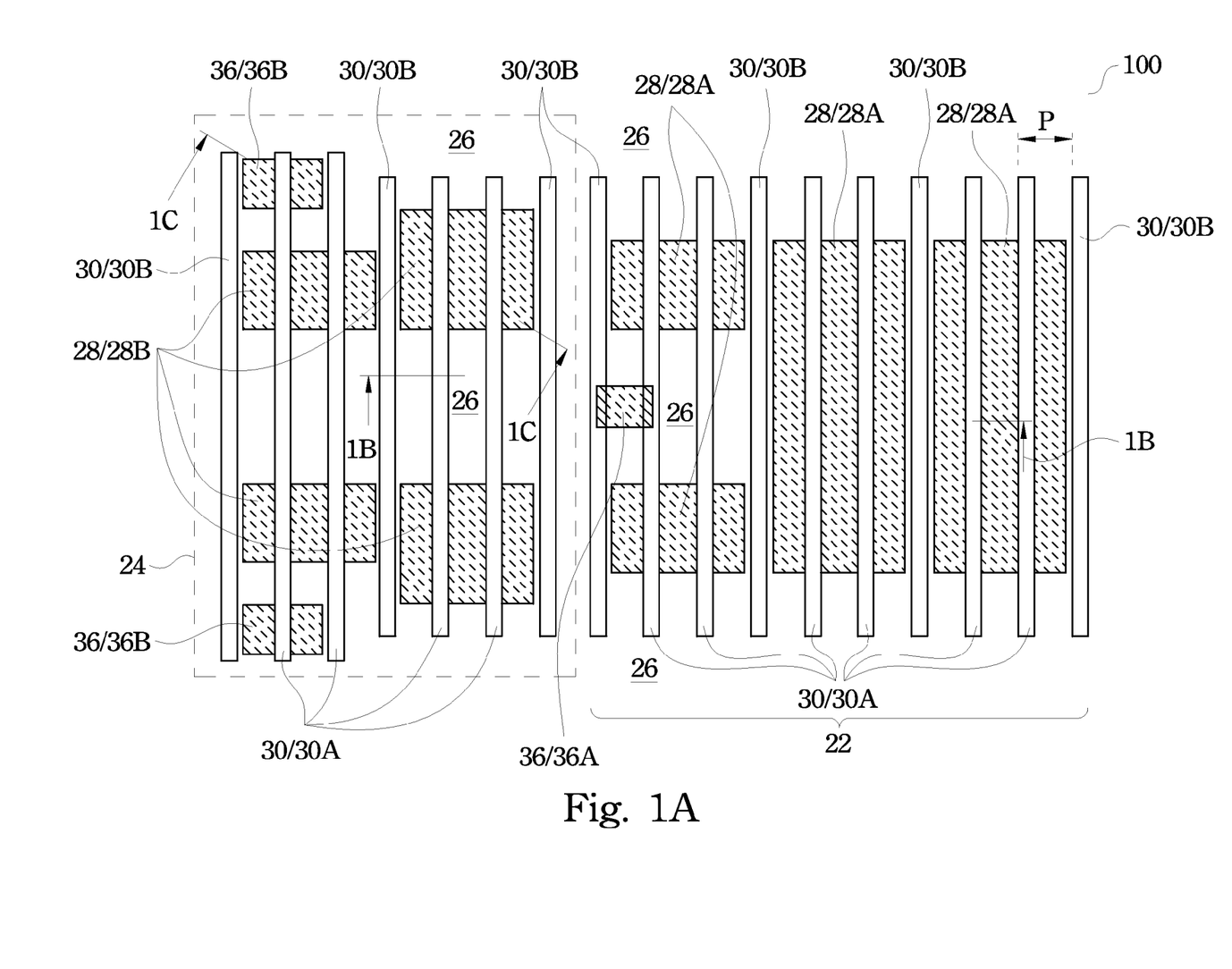
FIGS. 1A, 1B, and 1C illustrate a top view and cross-sectional views of a circuit comprising parallel gate electrode lines, a p-well pickup region, and an n-well pickup region.
Figure 1B:
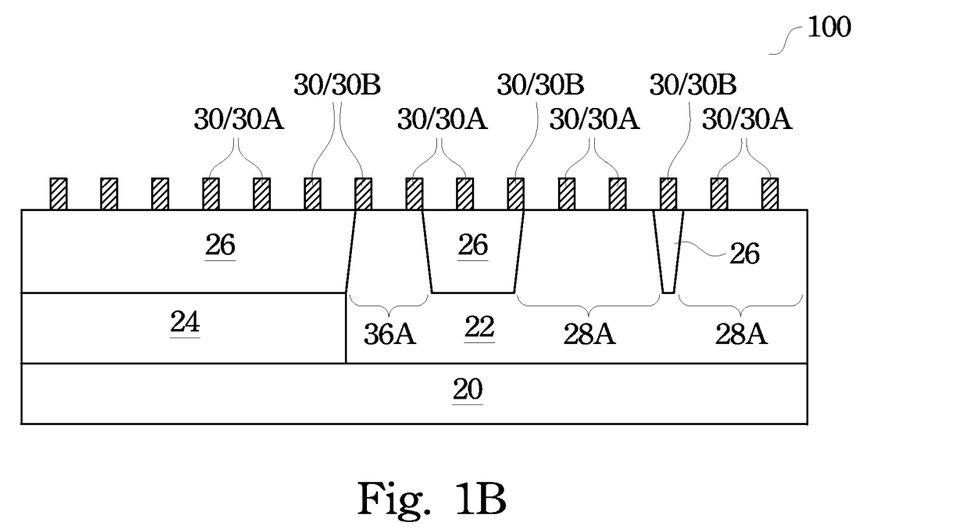
Figure 1C:
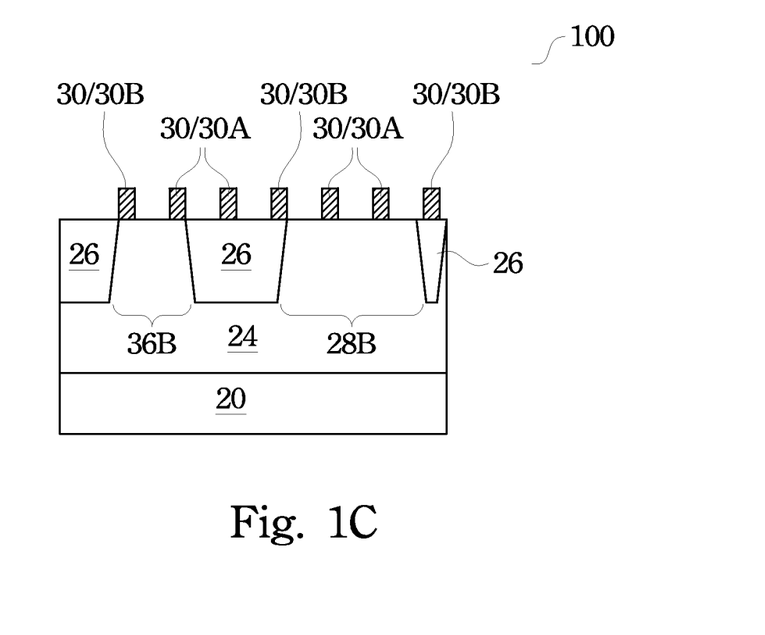

FIGS. 1A, 1B, and 1C illustrate a top view and cross-sectional views of a portion of wafer 100. In an exemplary embodiment, wafer 100 comprises semiconductor substrate 20 (not shown in FIG. 1A, please refer to FIGS. 1B and 1C). P-well region 22 and n-well region 24 are formed in semiconductor substrate 20. Isolation regions 26 are formed in p-well region 22 and n-well region 24. In an exemplary embodiment, isolation regions 26 are shallow trench isolation (STI) regions, and hence are alternatively referred to as STI regions 26 hereinafter.

Active regions 28 (including 28A and 28B) are formed in p-well region 22 and n-well region 24, and may be encircled by STI regions 26. Accordingly, the patterns of active regions 28 are defined by STI regions 26. Active regions 28A are portions of p-well region 22, and hence are of p-type. Active regions 28B are portions of n-well region 24, and hence are of n-type.

A plurality of gate electrode lines 30 (including 30A and 30B) are formed over p-well region 22, n-well region 24, and STI regions 26. In an embodiment, gate electrodes lines 30 are formed of polysilicon (POLY), and hence are referred to as POLY lines 30 throughout the description although they can also be formed of other conductive materials such as metals, metal silicides, and the like. POLY lines 30 are parallel lines having their lengthwise directions parallel to each other. Furthermore, POLY lines 30 may have a uniform pitch P, although POLY lines 30 may also have pitches different from each other. POLY lines 30 include active POLY lines 30A that cross over active regions 28A and/or 28B. Accordingly, active POLY lines 30A form gate electrodes of transistors. For example, active POLY lines 30A form nMOS transistors with p-type active regions 28A, and form PMOS transistors with n-type active regions 28B. POLY lines 30 further include dummy POLY lines 30B that do not cross over active regions 28A and/or 28B. Dummy POLY lines 30B do not form gate electrodes of any transistor, and may be electrically floating when the respective integrated circuit is power up.

Well pickup regions 36, which include p-well pickup region(s) 36A and n-well pickup region(s) 36B, are formed on the surfaces of p-well region 22 and n-well region 24 (refer to FIGS. 1B and 1C), respectively. In an embodiment, each of well pickup regions 36 includes a portion between two neighboring POLY lines 30, which may be active POLY line 30A and/or dummy POLY line 30B. Well pickup regions 36 may also extend to directly underlying a POLY line 30, which may also be active POLY line 30A or dummy POLY line 30B. Furthermore, one or more of well pickup regions 36 (such as well pickup region 36B) may extend into several inter-poly-line spacings.

FIG. 1B illustrates a cross-sectional view of the structure shown in FIG. 1A, wherein the cross-sectional view is obtained from the plane crossing lines 1B-1B in FIG. 1A. FIG. 1C illustrates a cross-sectional view obtained from the plane crossing lines 1C-1C in FIG. 1A.

Figure 2A:
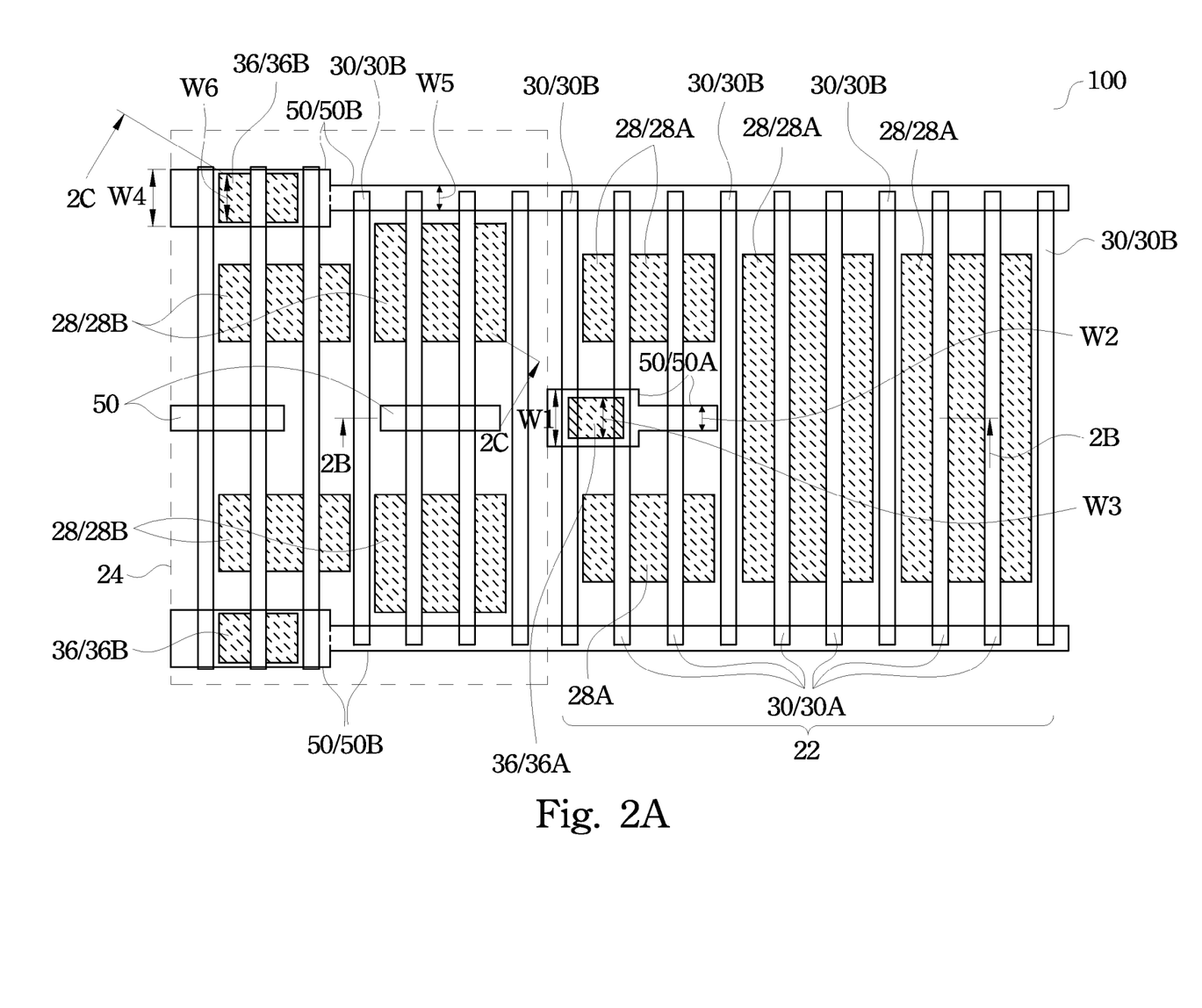
FIGS. 2A, 2B, and 2C illustrate a top view and cross-sectional views of a circuit, wherein a POLY cut layer comprising POLY cut openings are formed over the structure shown in FIG. 1A.
Figure 2B:
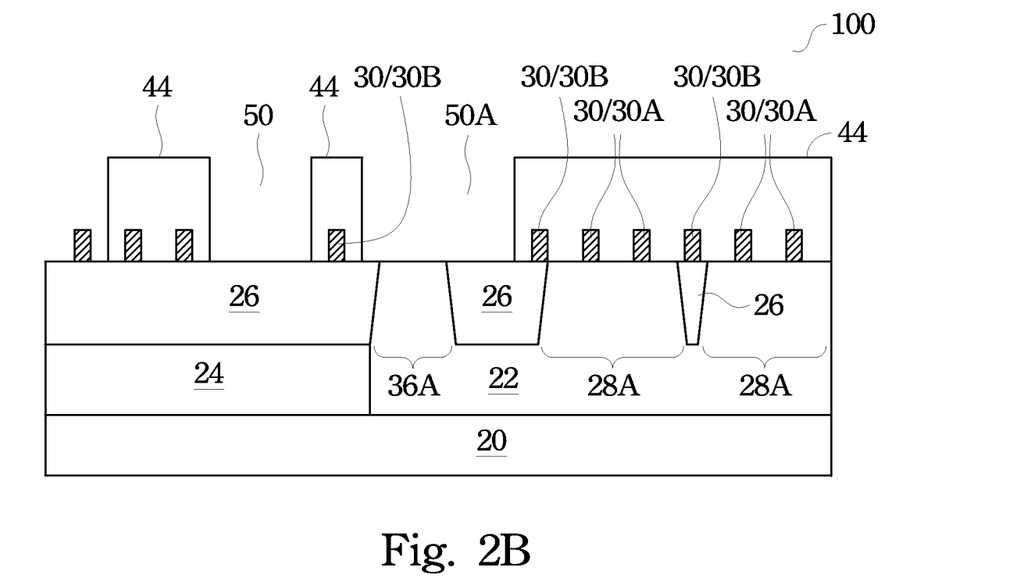
Figure 2C:
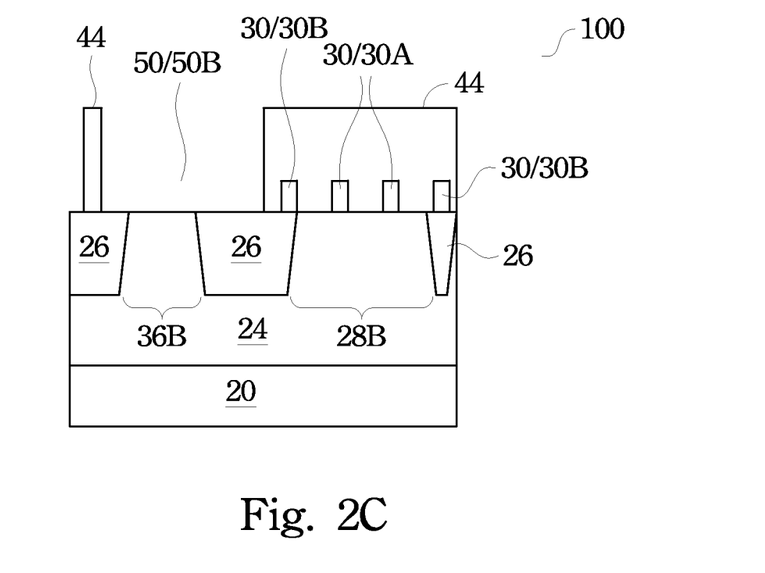

Referring to FIGS. 2B and 2C, POLY cut layer 44 is formed, wherein FIGS. 2B and 2C are cross-sectional views of the structure shown in FIG. 2A (a top view), with the cross-sectional view obtained from planes crossing lines 2B-2B and 2C-2C, respectively, in FIG. 2A. In an embodiment, POLY cut layer 44 is formed of a photo resist, although it may also be formed a hard mask such as a silicon nitride layer. Throughout the description, POLY cut layer 44 is alternatively referred to as a mask layer since it acts as a mask for patterning POLY lines 30. POLY cut layer 44 may be blanket formed to cover the entire wafer 100. The blanket POLY cut layer 44 is then patterned, and POLY cut openings 50A and 50B are formed, through which well pickup regions 36/36A/36B are exposed.

Referring to FIG. 2A, POLY cut opening 50A includes a first and a second portion, with the first portion having width W1 greater than width W2 of the second portion. It is appreciated that in FIG. 2A, POLY cut layer 44 actually covers most parts of wafer 100, and only the portions illustrated as POLY cut openings 50 are not covered. The first and the second portions of POLY cut opening 50A form a T-shape. Width W1 is also greater than width W3 of p-well pickup region 36A, wherein widths W1, W2, and W3 are measured in the direction parallel to the lengthwise direction of POLY lines 30. One of the reasons that the second portion is narrower than the first portion is that the first portion needs to be larger than p-well pickup region 36A so that the entirety of p-well pickup region 36A is exposed through POLY cut opening 50A, while to follow the design rules with minimum chip area penalty, the second portion of POLY cut opening 50A is made narrower. In addition to p-well pickup region 36A, portions of POLY lines 30 are also exposed through POLY cut opening 50A. In an embodiment, as shown in FIG. 2A, the exposed portions of POLY lines 30 include portions of active POLY line 30A and/or a portion(s) of dummy POLY line(s) 30B.

POLY cut opening 50B may also include a first and a second portion, with the first portion having width W4 greater than width W5 of the second portion. Accordingly, the first and the second portions form a T-shape. Width W4 may also be greater than width W6 of n-well pickup region 36B, and an entirety of n-well pickup region 36B may be exposed through POLY cut opening 50B. Widths W4, W5, and W6 are also measured in the direction parallel to the lengthwise direction of POLY lines 30. In addition to n-well pickup region 36B, portions of POLY lines 30 are also exposed through POLY cut opening 50B. In an embodiment, as shown in FIG. 2A, the exposed portions of POLY lines 30 include portions of active POLY line 30A and a portion(s) of dummy POLY line(s) 30B. The end portions of a plurality of POLY lines 30 may also be exposed through POLY cut opening 50B.

Figure 3:
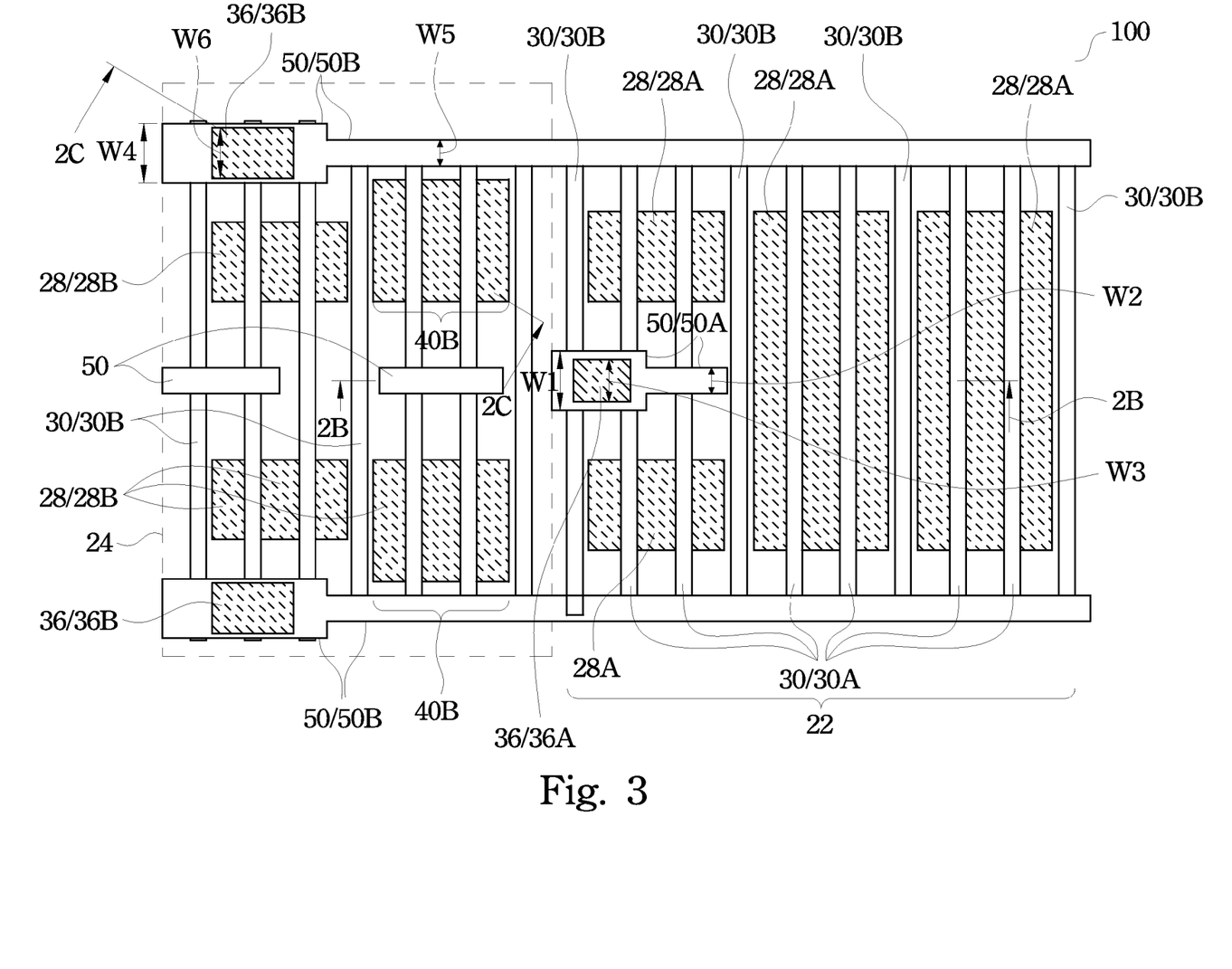
FIG. 3 illustrates that gate electrode lines are removed from the POLY cut openings.

Referring to FIG. 3, the portions of POLY lines 30 exposed through POLY cut openings 50/50A/50B are etched. In the illustrated embodiment, one of POLY lines 30A that extends over two active regions 28A may be separated into two portions, each extending to directly over one of active regions 28A. Accordingly, by etching the portion of POLY line 30A, the gate electrodes of two transistors, each formed on one of active regions 28A and a portion of etched POLY line 30A, are separated from each other. The end portions of POLY lines 30 exposed through POLY cut openings 50B are also etched.

Figure 4A:
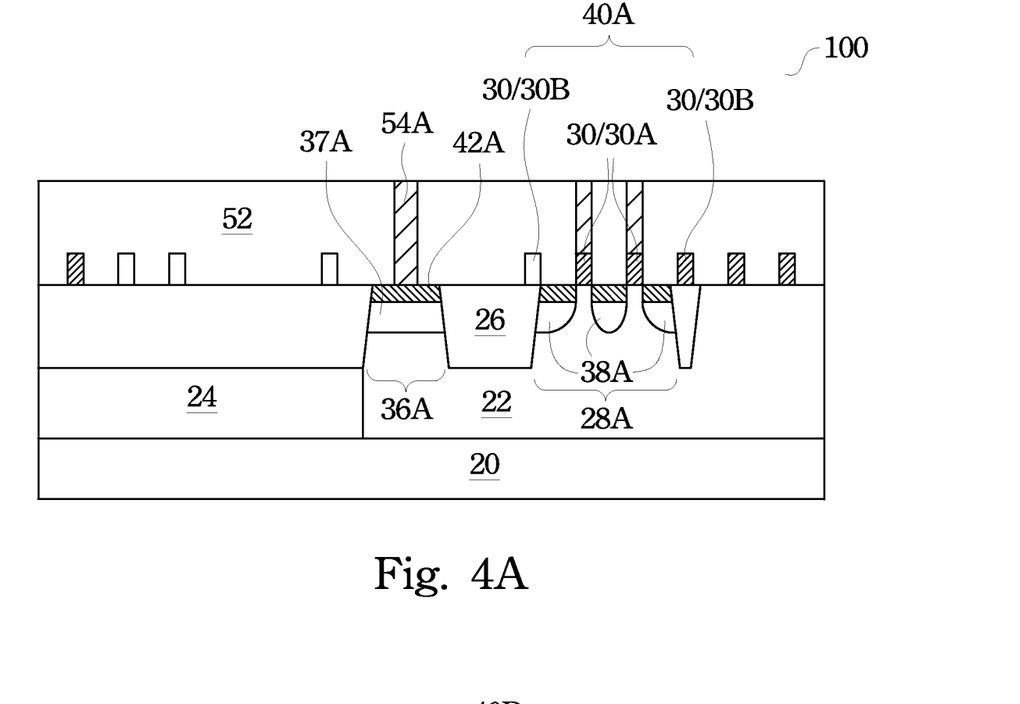
FIGS. 4A and 4B illustrate the formation of contact plugs.
Figure 4B:
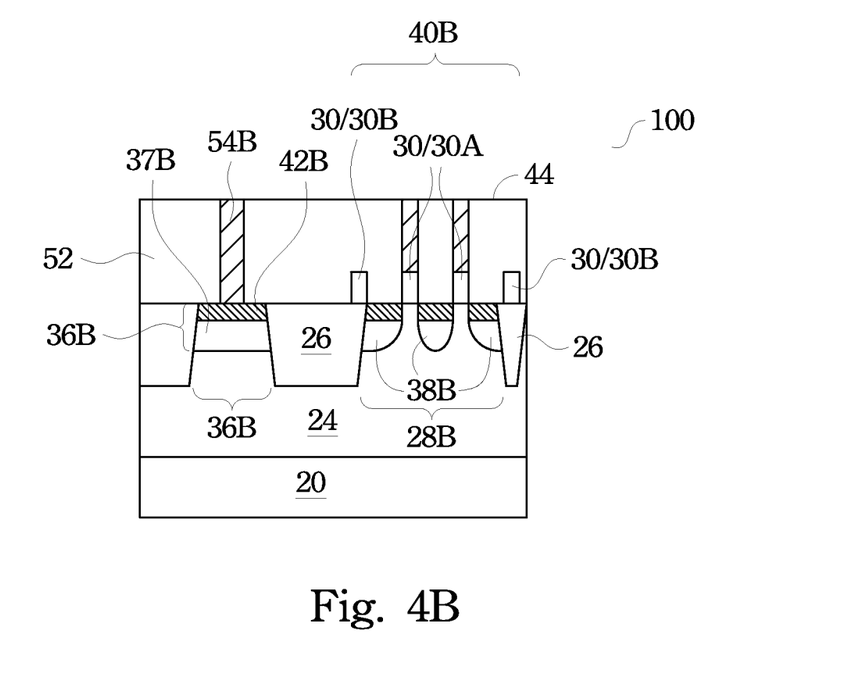

FIGS. 4A and 4B illustrate the removal of POLY cut layer 44, the formation of heavily doped regions 37A/37B and silicide regions 42A/42B, and the formation of inter-layer dielectric (ILD) 52 and contact plugs 54A and 54B. It is appreciated that although heavily doped regions 37A/37B, source/drain regions 38A/38B, and silicide regions 42A/42B are shown as formed after the removal of POLY cut layer 44 in some embodiments, some or all of them may also be formed before the formation of POLY cut layer 44 in alternative embodiments. As shown in FIGS. 4A and 4B, first, POLY cut layer 44 is removed. A p-type impurity implantation is performed, so that p-well pickup region 36A includes a heavily doped p-type region 37A over and contacting a portion of p-well region 22. Heavily doped p-type region 37A may be doped with a p-type impurity to an impurity concentration higher than about $10^{19}/cm^3$, for example. Source and drain regions (referred to as source/drain regions hereinafter) 38A are also formed in active regions 28A as a result of the p-type impurity implantation, wherein source/drain regions 38A and active POLY lines 30A form nMOS transistor 40A, which may comprise a plurality of sub-transistors connected in parallel, with each of the sub-transistors formed of one POLY line 30A and the respective source/drain regions 38A.

After an n-type impurity implantation, n-well pickup region 36B includes a heavily doped n-type region 37B over and contacting n-well region 24. Heavily doped n-type region 37B may be doped with an n-type impurity to an impurity concentration higher than about $10^{19}/cm^3$, for example. Source/drain regions 38B are also formed in active regions 28B as a result of the n-type impurity implantation, wherein source/drain regions 38B and active POLY lines 30A form p-type transistor 40B, which may comprise a plurality of sub-transistors connected in parallel, with each of the sub-transistors formed of one POLY line 30A and the respective source/drain regions 38B. Metal silicide regions 42A and 42B may also be formed, for example, using a salicide process, wherein silicide region 42A and 42B are directly over and contacting the underlying heavily doped p-type region 37A and heavily doped n-type region 37B, respectively.

Next, ILD 52 is formed, followed by the formation of contact plugs 54A and 54B. As shown in FIG. 4A, contact plug 54A is formed directly over, and electrically connected to, p-well pickup region 36A. Furthermore, silicide region 42A may be in physical contact with contact plug 54A. As shown in FIG. 4B, contact plug 54B is formed directly over, and electrically connected to, n-well pickup region 36B. In addition, silicide region 42B may be in physical contact with contact plug 54B. In the structure shown in FIGS. 4A and 4B, dummy POLY lines 30B may not be connected to any contact plug, and may be electrically floating.

Figure 5:
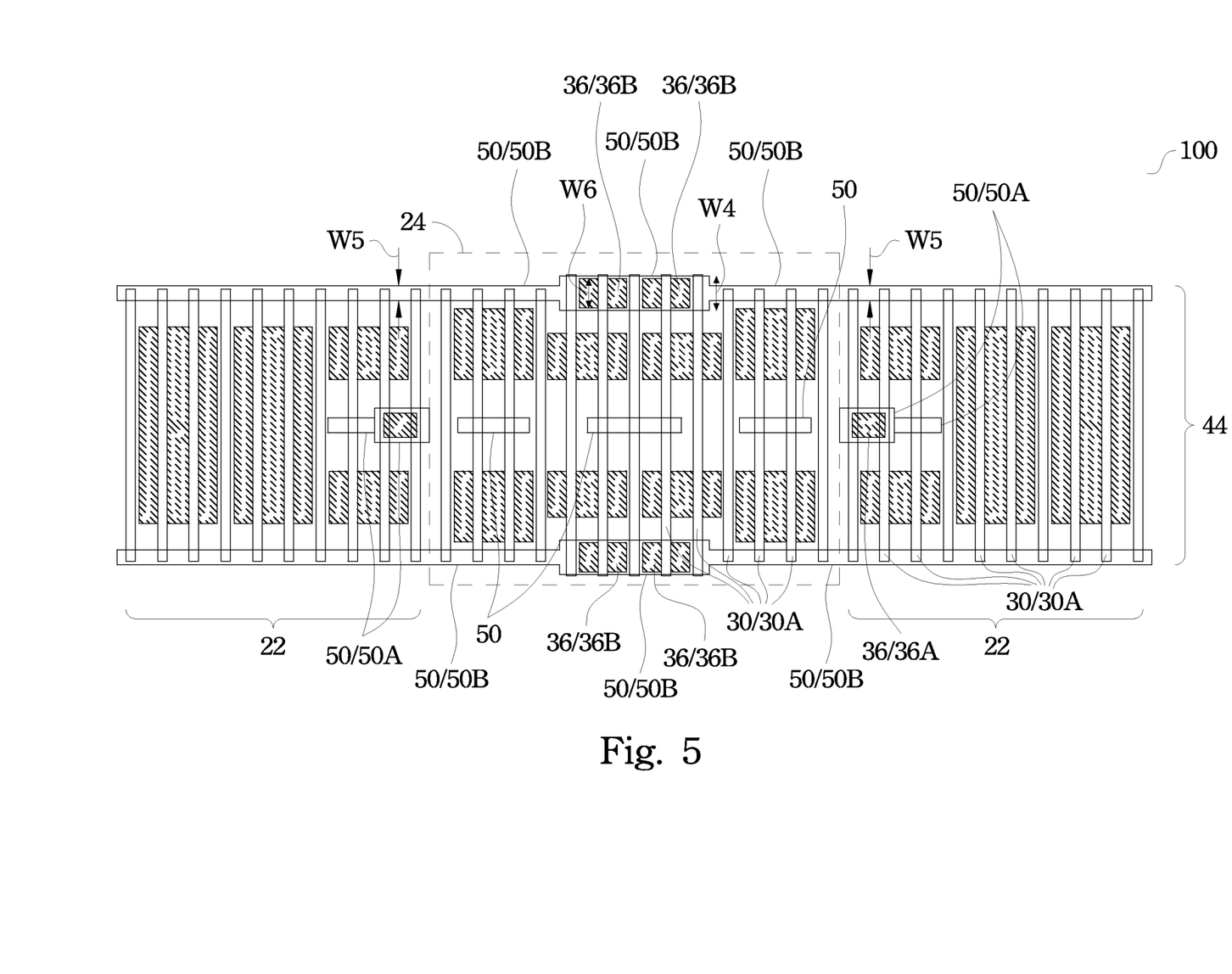
FIG. 5 illustrates a top view of a circuit and a POLY cut layer formed over the circuit, wherein the POLY cut layer comprises double T-shaped POLY cut openings.

FIG. 5 illustrates a top view of POLY cut layer 44 and the respective POLY cut openings 50A and 50B in accordance with an alternative embodiment. Unless specified otherwise, the reference numerals in this embodiment represent like elements in the embodiments illustrated in FIGS. 1A through 4B. This embodiment is essentially the same as in the embodiments shown in FIGS. 1A through 4B, except POLY cut openings 50A and 50B include double T-shaped openings, such as what is shown as 50B. Similar to what is shown in FIG. 2A, POLY cut layer 44 actually covers most parts of wafer 100, and only the portions illustrated as POLY cut openings 50 are not covered. The wide portion (with width W4) of POLY cut opening 50B forms a first T-shape, with a narrow portion (with width W5) of POLY cut opening 50A on its left. Furthermore, the wide portion forms a second T-shape with another narrow portion (also with width W5) of POLY cut opening 50A on its right. The process steps in this embodiment, such as forming POLY cut layer 44, forming POLY cut openings 50, removing exposed portions of POLY lines 30, removing POLY cut layer 44, and forming contact plugs 54A/54B may be referred to FIGS. 1 through 4B.

Referring to FIGS. 3 and 5, it is observed that well pickup regions 36 are not necessarily formed between two dummy POLY lines 30B. Instead, well pickup regions 36 may be formed next to the POLY lines 30A that is also for forming the gate electrodes of transistors. Accordingly, there is no need to form additional dummy POLY lines 30B and inserting well pickup regions 36 between the additional dummy POLY lines 30B. Chip area is thus saved. By using the embodiments, the chip area of a standard cell may be saved by more than 20 percent.

In accordance with embodiments, a method of forming integrated circuits includes forming a mask layer over a gate electrode line, wherein the gate electrode line is over a well region of a semiconductor substrate; forming an opening in the mask layer, wherein a portion of the gate electrode line and a well pickup region of the well region are exposed through the opening; and removing the portion of the gate electrode line through the opening.

In accordance with other embodiments, a method includes blanket forming a mask layer over a semiconductor wafer. The semiconductor wafer includes a plurality of gate electrode lines including dummy gate electrode lines and active gate electrode lines, wherein the plurality of gate electrode lines are parallel to each other and have a uniform pitch; a well region; a well pickup region of the well region, wherein the well pickup region includes a portion between two neighboring ones of the plurality of gate electrode lines; and an active region, wherein one of the plurality of gate electrodes and the active region form a transistor. The method further includes forming an opening in the mask layer to expose the one of the plurality of electrode lines and the well pickup region; etching portions of the plurality of gate electrode lines exposed through the opening; forming an ILD over the plurality of gate electrode lines and the well pickup region; and forming a contact plug in the ILD and electrically coupled to the well pickup region.

In accordance with yet other embodiments, a method includes blanket forming a mask layer over a semiconductor wafer, wherein the semiconductor wafer includes a plurality of gate electrode lines comprising dummy gate electrode lines and active gate electrode lines, and wherein the plurality of gate electrode lines are parallel to each other and have a uniform pitch. The semiconductor wafer further includes a p-well region and an n-well region; and a p-well pickup region and an n-well pickup region directly over the p-well region and the n-well region, respectively. The method further includes forming a first and a second opening in the mask layer, wherein the p-well pickup region and two of the plurality of gate electrode lines are exposed through the first opening, and wherein the n-well pickup region and additional two of the plurality of gate electrode lines are exposed through the second opening. Portions of the plurality of gate electrode lines exposed through the first and the second openings are then etched. An ILD is formed over the plurality of gate electrode lines and the first and the second well pickup regions. A first and a second contact plug are formed in the ILD and electrically coupled to the first and the second well pickup regions, respectively.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a mask layer over a gate electrode line, wherein the gate electrode line is over a well region of a semiconductor substrate;
   forming a first opening in the mask layer, wherein a portion of the gate electrode line and a well pickup region of the well region are exposed through the first opening; and
   removing the portion of the gate electrode line through the first opening.

2. The method of claim 1, wherein the first opening comprises a first portion and a second portion, with the first portion having a first width greater than a second width of the second portion, and wherein the first and the second widths are measured in a direction parallel to a lengthwise direction of the gate electrode line.

3. The method of claim 2, wherein the first opening further comprises a third portion having a width smaller than the first width, and wherein the second and the third portions are on opposite sides of the first portion.

4. The method of claim 1, wherein the gate electrode line is a dummy gate line not connected to a gate electrode of any transistor.

5. The method of claim 1, wherein the gate electrode line is an active gate line connected to a first gate electrode of a first transistor.

6. The method of claim 5, wherein the gate electrode line is further connected to a second gate electrode of a second transistor, and wherein after the step of removing, the first and the second gate electrodes are disconnected from each other.

7. The method of claim 1, wherein after the step of forming the first opening, both a dummy gate electrode line and an active gate electrode line are exposed through the first opening, and wherein the well pickup region comprises a portion between the dummy gate electrode line and the active gate electrode line.

8. The method of claim 1 further comprising, after the step of removing:
   forming an inter-layer dielectric (ILD) over a remaining portion of the gate electrode line; and
   forming a contact in the ILD and electrically coupled to the well pickup region.

9. The method of claim 1, wherein the well region is a p-well region, and wherein the method further comprising:
   at a time the step of forming the first opening is performed, simultaneously forming a second opening in the mask layer, wherein a portion of an additional gate electrode line and an n-well pickup region of an n-well region are exposed through the second opening; and
   removing the portion of the additional gate electrode line through the second opening.

10. The method of claim 1 further comprising, after the portion of the gate electrode line is removed through the first opening, removing the mask layer.

11. A method comprising:
    blanket forming a mask layer over a semiconductor wafer comprising:
    a plurality of gate electrode lines comprising dummy gate electrode lines and active gate electrode lines, wherein the plurality of gate electrode lines are parallel to each other and have a uniform pitch;

a well region;

a well pickup region of the well region, wherein the well pickup region comprises a portion between two neighboring ones of the plurality of gate electrode lines; and an active region, wherein one of the plurality of gate electrodes and the active region form a transistor;

forming an opening in the mask layer to expose the one of the plurality of electrode lines and the well pickup region;

etching portions of the plurality of gate electrode lines exposed through the opening;

forming an inter-layer dielectric (ILD) over the plurality of gate electrode lines and the well pickup region; and forming a contact plug in the ILD and electrically coupled to the well pickup region.

12. The method of claim 11, wherein after the step of etching, an entirety of the well pickup region is exposed through the opening.

13. The method of claim 12, wherein the opening has a T-shape comprising a first portion having a first width and a second portion having a second width smaller than the first width, and wherein the well pickup region is exposed through the first portion of the opening.

14. The method of claim 11, wherein a dummy gate electrode line is further exposed through the opening.

15. The method of claim 11, wherein the one of the plurality of gate electrode lines comprises two portions forming gate electrodes of two transistors, and wherein after the step of etching, the two portions are disconnected from each other.

16. The method of claim 11, wherein the well region is a p-well region.

17. The method of claim 11, wherein the well region is an n-well region.

18. A method comprising:

blanket forming a mask layer over a semiconductor wafer, wherein the semiconductor wafer comprises:

a plurality of gate electrode lines comprising dummy gate electrode lines and active gate electrode lines, wherein the plurality of gate electrode lines are parallel to each other and have a uniform pitch;

a p-well region and an n-well region; and a p-well pickup region and an n-well pickup region directly over the p-well region and the n-well region, respectively;

forming a first and a second opening in the mask layer, wherein the p-well pickup region and two of the plurality of gate electrode lines are exposed through the first opening, and wherein the n-well pickup region and additional two of the plurality of gate electrode lines are exposed through the second opening;

etching portions of the plurality of gate electrode lines exposed through the first and the second openings;

forming an inter-layer dielectric (ILD) over the plurality of gate electrode lines, the p-well pickup region, and the n-well pickup region; and forming a first and a second contact plug in the ILD and electrically coupled to the p-well pickup region and the n-well pickup region, respectively.

19. The method of claim 18 further comprising a p-type transistor comprising a first source/drain region and an n-type transistor comprising a second source/drain region, wherein the first source/drain region comprises a portion between the additional two of the plurality of gate electrode lines, and wherein the second source/drain region comprises a portion between the two of the plurality of gate electrode lines.

20. The method of claim 18, wherein the two of the plurality of gate electrode lines comprise a first dummy gate electrode line and a first active gate electrode line, and wherein the additional two of the plurality of gate electrode lines comprise a second dummy gate electrode line and a second active gate electrode line.

21. The method of claim 18, wherein the plurality of gate electrode lines comprise an active gate electrode line exposed through one of the first and the second openings, wherein the active gate electrode line comprises two portions forming gate electrodes of two transistors, and wherein a portion of the active gate electrode line between the two portions is removed during the step of etching.

* * * * *